United States Patent [19]

Kinoshita et al.

[11] Patent Number: 4,617,254
[45] Date of Patent: Oct. 14, 1986

[54] PROCESS FOR FORMING DETAILED IMAGES

[75] Inventors: Akihiro Kinoshita, Munakata; Yohichi Namariyama, Koga; Hiromi Higashi, Zushi, all of Japan

[73] Assignee: Chisso Corporation, Ohsaka, Japan

[21] Appl. No.: 723,009

[22] Filed: Apr. 16, 1985

Related U.S. Application Data

[63] Continuation of Ser. No. 548,626, Nov. 4, 1983, abandoned.

[30] Foreign Application Priority Data

Nov. 4, 1982 [JP] Japan .................................. 57-193642

[51] Int. Cl.$^4$ ................................................. G03C 5/00
[52] U.S. Cl. .................................... 430/326; 430/270; 430/296; 430/331
[58] Field of Search ................. 430/270, 296, 326, 331

[56] References Cited

U.S. PATENT DOCUMENTS

| | | | |
|---|---|---|---|
| 4,012,536 | 3/1977 | Levine et al. | 430/296 |
| 4,018,937 | 4/1977 | Levine et al. | 430/326 |
| 4,264,715 | 4/1981 | Miura et al. | 430/296 |
| 4,302,529 | 11/1981 | Lai | 430/325 |
| 4,394,438 | 7/1983 | Van Pelt et al. | 430/326 |
| 4,401,745 | 8/1983 | Nakane et al. | 430/296 |

Primary Examiner—Jack P. Brammer
Attorney, Agent, or Firm—Beall Law Offices

[57] ABSTRACT

A process for forming a detailed image having a high sensitivity to far-UV light and capable of giving a positive type image with a high precision is provided, which process comprises applying onto a base a resist solution comprising an organic solution, of a homopolymer of methyl vinyl ketone or a copolymer thereof with a comonomer of the formula $R^1R^2C=CH_2$ wherein $R^1$ is H or $-CH_3$ and $R^2$ is acetoxy, nitrile, unsubstituted or substituted aryl or

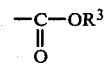

wherein $R^3$ is alkyl, to form a coating on the base; irradiating far-UV light; developing the coating with a developer composed mainly of a cellosolve compound; and rinsing or/and washing the resulting material.

20 Claims, No Drawings

PROCESS FOR FORMING DETAILED IMAGES

This application is a continuation, of application Ser. No. 548,626, filed Nov. 4, 1983, now abandoned.

BACKGROUND OF THE INVENTION

1. Field of the Invention

This invention relates to a process for forming detailed images. More particularly it relates to a process for forming detailed images with a high precision of 1 μm or less by forming a coating of a specified positive type resist on a base and irradiating far-ultraviolet light thereon followed by developing.

2. Description of the Prior Art

When far-ultraviolet light is used as the light source for photolysis reaction of polymers, its diffraction to light at the time of exposure is so small, due to its shorter wave length than that conventional ultraviolet light, that a high degree of resolution can be expected. Further, its energy is so great that it is advantageous for photolysis reaction of polymers. Thus, advent of a high sensitive resist suitable thereto has been desired.

As one of far-ultraviolet resists for positive type so far used, there is polymethyl methacrylate (PMMA), which, however, has a drawback that it is of low sensitivity. Further, polymethyl isopropenyl ketone (PMIK) has a drawback that it is not practical due to its inferior sensitivity and also its cost is high.

SUMMARY OF THE INVENTION

The object of the present invention is to provide a process for forming a detailed image having a high sensitivity to far-ultraviolet light and capable of giving a positive type image with a high precision.

The present inventors have studied polymers of methyl vinyl ketone (hereinafter abbreviated to MVK), for many years, and as a result have found that MVK and particularly copolymers of MVK have a high sensitivity and when an adequate developer is chosen, give a detailed positive type image with a high precision, and have attained the present invention.

The gist of the present invention resides in:

a process for forming detailed images, which comprises applying onto a base, an organic solvent solution as a resist solution, of a homopolymer of methyl vinyl ketone or a copolymer thereof with a comonomer expressed by the general formula $$R^1R^2C=CH_2$$

wherein $R^1$ represents a hydrogen atom or a methyl group and $R^2$ represents an acetoxy group, a nitrile group, an aryl group of 6 to 9 carbon atoms, an aryl group of 6 to 9 carbon atoms substituted by an electron attractive substituent or a group expressed by the general formula $$-\underset{\underset{O}{\|}}{C}-O-R^3$$

wherein $R^3$ represents hydrogen atom or an alkyl group of 1 to 8 carbon atoms, to form a coating on the base;

irradiating far-ultraviolet light onto the coating;

developing the resulting coating with a liquid as a developer, composed mainly of cellosolve compound expressed by the general formula $$R^4-O-CH_2CH_2OH$$

wherein $R^4$ represents an alkyl group of 1 to 4 carbon atoms; and rinsing or/and washing the resulting base.

DESCRIPTION OF THE INVENTION

MVK used in the present invention can be easily prepared by dehydrating commercially available γ-ketobutanol. MVK is of high utility value due to its cheapness.

As the comonomer used for the copolymer of MVK in the present invention, compounds expressed by the general formula $$R^1R^2C=CH_2$$

wherein $R^1$ and $R^2$ as defined above are suitable. Examples of such compounds are vinyl acetate, acrylonitrile, styrene, α-methylstyrene, vinyltoluene, chlorostyrene, bromostyrene, nitrostyrene, cyanostyrene, methyl methacrylate, ethyl methacrylate, butyl methacrylate, ethyl acrylate, octyl acrylate, etc.

As the resin for resists used in the present invention, copolymers of MVK with the above-mentioned comonomers are superior to MVK homopolymer due to their higher sensitivity. The proportion of MVK polymerized in the copolymers is in the range of 1 to 99% by mol, preferably 10 to 80% by mol, more preferably 13 to 70% by mol.

The MVK polymers may be prepared e.g. by purifying MVK alone or MVK and a comonomer to be copolymerized therewith, and polymerizing MVK or copolymerizing MVK with the comonomer in THF (tetrahydrofuran) as solvent in nitrogen stream at a temperature around 60° C. using a radical polymerization initiator such as azobisisobutyronitrile. The polymerization time is usually in the range of 5 to 100 hours. The resulting solution of polymer or copolymer is poured in a precipitant such as methanol to give polymer precipitate. The resulting polymer or copolymer has a molecular weight according to GPC usually in the range of 150,000 to 700,000. In the case of positive type resists, a higher molecular weight imparts a higher sensitivity and hence is advantageous, but as far as the molecular weight is in the above range, it is always possible to form a detailed image, by employing a suitable developer. In order to further elevate the resolution of the detailed image, it is preferable to restrict the polymerization yield to about 50% or lower, and in the case of copolymers, to carry out copolymerization so as to give a definite copolymer composition, and narrow the molecular weight distribution of polymer. Such polymers are dissolved in an organic solvent in which they are soluble to obtain a resist solution. As such solvent, a 1:1 mixed solution of chloroform and methyl cellosolve may be suitable, and besides this solution, ethyl cellosolve acetate, acetone, methyl ethyl ketone, chlorobenzene, tetrahydrofuran (THF), etc. may be also used.

Next, the resist solution is applied onto a base such as silicon wafer by means of e.g. spinner to form a coating thereon. In the application, the resin concentration in the resist solution may be preferably in the range of about 1 to 15% by weight. Usually it may be most suitably about 5% by weight, but in the case of higher molecular weights, a range of about 2 to 3% by weight may be most suitable. In advance of applying the resist solution, an adhesion-improving agent such as silicone compounds may be applied onto the base. After completion of the application, prebaking is usually carried out. The temperature may be in the range of about 60° to 150° C., preferably about 80° to 120° C. and the time may be in the range of about 2 to 30 minutes, preferably about 3 to 20 minutes.

Next, for example, a chrome mask resolved up to 0.5 μm is adhered onto the surface of the resist applied onto the base, followed by exposure to light. As for the light source used for the exposure, any of those which generate far-ultraviolet light may be employed. For example, a commercially available Deep UV lamp may be employed and a light source passing through a slit from its lamp house may be utilized. In an example of use of such a light source, the distance from the light house is 40 cm and the illuminance on the base is about 2.5 mW/cm².

Developing is then carried out. The developer used in the present invention is a liquid composed mainly of cellosolve compounds having an ether linkage and hydroxyl group, which compounds are expressed by the general formula $R^4$—O—$CH_2CH_2OH$ wherein $R^4$ is as defined above. One kind or two kinds or more of the compounds or mixtures thereof with lower alcohols may be used.

After the developing, rinsing or/and washing is carried out. As the liquid used therefor, lower alcohols or mixtures thereof with the above cellosolve compounds may be used. By such rinsing or washing, it is possible to remove a remaining coating at the irradiated part after the developing. Thus, a detailed image is formed on the base.

After the detailed image is formed, heating in air is usually carried out in order to improve resistance to etching.

The present invention will be further described by way of Examples, but it is not intended that the present invention is limited thereby. In addition, "poly(A-B)" referred to hereinafter means a copolymer of a monomer A with a monomer B.

EXAMPLE 1

A poly(methyl vinyl ketone-styrene) (methyl vinyl ketone content, 43% by mol; $\overline{M}_w/\overline{M}_n=1.7$, $\overline{M}_n=370,000$, according to Gel Permeation Chromatography (GPC)) prepared by radical polymerization was dissolved in a 1:1 mixed solvent of chloroform with methyl cellosolve acetate to obtain a solution having a polymer concentration of 5.0% by wt./vol. which was used as a resist solution. This solution was applied onto a $SiO_2$-processed silicon wafer dried in advance in a clean oven at 250° C. for 30 minutes or longer, at a spinner revolution number of 1,000 rpm. The resulting material was prebaked in air at 80° C. for 5 minutes to form a coating of about 0.7 μm thick on the base, followed by adhering a chrome mask onto the surface of the resist applied onto the base and then carrying out exposure to light at room temperature, for 20 seconds. In the exposure, a Deep UV lamp was used as light source, and far-UV light was passed through a slit of the light house. The distance between the resist surface and the light source was 40 cm, and the illuminance on the resist surface was about 2.5 mW/cm², Developing was carried out by immersing the base in a 7:3 mixed solvent of butyl cellosolve:methanol at 25° C. for 2 minutes with continuous stirring, followed by rinsing with methanol at 25° C. for one minute. Postbaking was then carried out at 80° C. for 10 minutes. The resulting pattern of detailed image was observed with an optical microscope, to confirm that the resulting pattern was resolved up to 0.75 μm.

EXAMPLE 2

A detailed image was formed on a base as in Example 1 except that a poly(methyl vinyl ketone-methyl methacrytate) (methyl vinyl ketone content, 30% by mol; $\overline{M}_w/\overline{M}_n=2.3$, $\overline{M}_n=210,000$ according to GPC) prepared by radical polymerization was used; a 5:2 mixed solvent of butyl cellosolve and ethyl cellosolve was used as developer; and rinsing was carried out using a 1:1 mixed solution of (a 2:3 mixed solution of butyl cellosolve and ethyl cellosolve) and methanol. As a result, a pattern resolved up to 0.75 μm was obtained.

EXAMPLE 3

A detailed image was formed on a base as in Example 1 except that an adhesion-improving agent containing a silicone compound was applied in advance onto the wafer and the resist solution was then applied thereonto at a spinner revolution number of 2,000 rpm to give a resist coating of 0.5 μm thick, followed by exposure to light for 5 seconds. As a result, a pattern resolved up to 0.75 μm was formed on the wafer.

EXAMPLE 4

A detailed image was formed as in Example 1 except that the resist solution was applied at a spinner revolution number of 3,000 rpm to give a resist coating of about 0.4 μm thick, followed by exposure to light for 2 or 5 seconds. As a result, patterns resolved up to 0.5 μm were obtained in either cases.

REFERENCE EXAMPLE

The wafer having a detailed image formed thereon in Example 4 was etched with an etching agent for $SiO_2$ etching, consisting of a mixed solution of aqueous hydrogen fluoride and ammonium fluoride (molar ratio, 3.53:10.5) at the $SiO_2$ exposed part of the wafer, followed by water-washing and drying. Thereafter the resist part was peeled off with an organic solvent or a mixed solution of hydrogen peroxide and concentrated sulfuric acid, to form a detailed image of $SiO_2$ on the Si base.

EXAMPLE 5

A detailed image was formed as in Example 2 except that an adhesion-improving agent containing a silicone compound was undercoated in advance on the wafer; the resist solution was applied at a spinner revolution number of 2,000 rpm to give a resist coating of 0.5 μm thick, followed by exposure to light for one minute; a 5:1 mixed solvent of butyl cellosolve and ethyl cellosolve was used as developer; rinsing was carried out with a 1:1 mixed solution of (a 5:1 mixed solvent of butyl cellosolve and ethyl cellosolve) and methanol; and washing was carried out with butyl alcohol for 50 seconds. As a result, a pattern resolved up to 0.5 μm was formed on the wafer.

What we claim is:

1. A process for forming detailed positive type images which comprises:
   providing a base;

applying a resist solution to the base, said resist solution comprising an organic solvent and 1–15% by weight of at least one of a homopolymer of methyl vinyl ketone and a copolymer thereof with a comonomer selected from the group consisting of: vinyl acetate, acrylonitrile, styrene, α-methylstyrene, vinyltoluene, chlorostyrene, bromostyrene, nitrostyrene, cyanostyrene, methyl methacrylate, ethyl methacrylate, butyl methacrylate, ethyl acrylate and octyl acrylate, wherein the proportion of methyl vinyl ketone in the copolymer is at least 10% by mol, to form a coating on the base;

imagewise irradiating the coating with far-ultraviolet light; developing the resulting coating with a liquid solvent as a developer, said liquid selected from the group consisting of at least one cellosolve compound and at least one cellosolve compound mixed with a lower alcohol wherein the cellosolve compound is expressed by the formula $R^4-O-CH_2CH_2OH$ wherein $R^4$ represents an alkyl group of 1 to 4 carbon atoms; and at leasst one of rinsing and washing the base after the developing.

2. A process of claim 1 wherein said organic solvent is at least one member selected from the group consisting of a mixed solvent of chloroform and methyl cellosolve acetate and ethyl cellosolve acetate, acetone, methyl ethyl ketone, chlorobenzene and tetrahydrofuran.

3. A process according to claim 1, wherein the proportion of methyl vinyl ketone co-polymerized with the comonomer is in the range of 10 to 80% by mol and preferably 13 to 70% by mol.

4. A process according to claim 1, wherein after the applying step, the coated base is heated to a temperature in the range of about 60°–150° C. for about 2–30 minutes.

5. A process according to claim 4, wherein the coated base is heated to a temperature of about 80° C. for about 3–20 minutes.

6. A process according to claim 1, wherein, before irradiating, a chrome mask is adhered to the coated surface of the base.

7. A process according to claim 1, wherein in the irradiating step the coated base is subjected to an illuminance of 2.5 mW/cm$^2$ of far-ultraviolet light and wherein the light source is separated from the base by a distance of 40 cm.

8. A process according to claim 1, wherein the developer liquid is selected from the group consisting of butyl cellosolve and methanol mixed solvent and butyl cellosolve and ethyl cellosolve mixed solvent.

9. A process according to claim 1, wherein a silicone compound is applied to the base before the applying step as an adhesion improving agent.

10. A process according to claim 1, wherein the cellosolve compound used in the developing step is also used for rinsing and drying.

11. A process according to claim 1 wherein the organic solvent is selected from the group consisting of a mixed solution of chloroform and methyl cellosolve, ethyl cellosolve acetate, acetone, methyl ethyl ketone, chlorobenzene, tetrahydrofuran.

12. A process according to claim 1, wherein the concentration of polymer in the resist solution is up to about 5% by weight.

13. A process according to claim 1, wherein the liquid solvent developer is a 5:2 mixture of butyl cellosolve and ethyl cellosolve.

14. A process according to claim 1, wherein the liquid solvent developer is a 7:3 mixture of butyl cellosolve and methanol.

15. A process according to claim 1, wherein the liquid solvent developer is a 5:1 mixture of butyl cellosolve and ethyl cellosolve.

16. A process according to claim 1, wherein the homopolymer or copolymer has a molecular weight in the range of 150,000 to 700,000.

17. A process according to claim 3 wherein said comonomer is in the range of 13 to 70% by mol.

18. A process for forming detailed positive type images which comprises:

providing a base;

applying a resist solution to the base, said resist solution comprising an organic solvent and 1–15% by weight of at least one of a homopolymer of methyl vinyl ketone and a copolymer thereof with a comonomer selected from the group consisting of: vinyl acetate, acrylonitrile, styrene, α-methylstyrene, vinyltoluene, chlorostyrene, bromostyrene, nitrostyrene, cyanostyrene, methyl methacrylate, ethyl methacrylate, butyl methacrylate, ethyl acrylate and octyl acrylate, wherein the proportion of methyl vinyl ketone in the copolymer is at least 30% by mol, to form a coating on the base;

imagewise irradiating the coating with far-ultraviolet light;

developing the resulting coating with a liquid solvent as a developer, said liquid selected from the group consisting of at least one cellosolve compound and at least one cellosolve compound mixed with a lower alcohol wherein the cellosolve compound is expressed by the formula $R^4-O-CH_2CH_2OH$ wherein $R^4$ represents an alkyl group of 1 to 4 carbon atoms; and at least one of rinsing and washing the base after the developing.

19. A process according to claim 18, wherein the proportion of methyl vinyl ketone in the copolymer is at least 13% by mol.

20. A process according to claim 12 wherein the concentration of polymer in the resist solution is in the range of 2 to 3% by weight.